(12) United States Patent
Wen

(10) Patent No.: US 9,190,280 B2
(45) Date of Patent: Nov. 17, 2015

(54) METHOD FOR MANUFACTURING LATERALLY DIFFUSED METAL OXIDE SEMICONDUCTOR DEVICE

(71) Applicants: Peking University Founder Group Co., Ltd., Beijing (CN); Founder Microelectronics International Co., Ltd., Shenzhen (CN)

(72) Inventor: Zhengfeng Wen, Shenzhen (CN)

(73) Assignees: PEKING UNIVERSITY FOUNDER GROUP CO., LTD., Beijing (CN); FOUNDER MICROELECTRONICS INTERNATIONAL CO., LTD., Shenzhen (CN)

( * ) Notice: Subject to any disclaimer, the term of this patent is extended or adjusted under 35 U.S.C. 154(b) by 26 days.

(21) Appl. No.: 14/096,976

(22) Filed: Dec. 4, 2013

(65) Prior Publication Data

US 2015/0037969 A1 Feb. 5, 2015

(30) Foreign Application Priority Data

Jul. 30, 2013 (CN) .......................... 2013 1 0325729

(51) Int. Cl.
*H01L 21/3205* (2006.01)
*H01L 21/28* (2006.01)

(52) U.S. Cl.
CPC .............................. *H01L 21/28052* (2013.01)

(58) Field of Classification Search
CPC ........ H01L 21/28; H01L 29/78; H01L 21/336
USPC ........... 438/592, 586, 303; 257/288, E29.255
See application file for complete search history.

(56) References Cited

U.S. PATENT DOCUMENTS

| | | | |
|---|---|---|---|
| 2009/0130833 A1* | 5/2009 | Hayashi et al. ............... | 438/592 |
| 2010/0210100 A1* | 8/2010 | Koyama et al. ............... | 438/591 |
| 2010/0227463 A1* | 9/2010 | Cho ............................... | 438/586 |
| 2011/0244670 A1* | 10/2011 | Richter et al. ................ | 438/585 |
| 2011/0269276 A1* | 11/2011 | Kwon et al. ................... | 438/199 |
| 2012/0007164 A1* | 1/2012 | Sugihara ........................ | 257/316 |
| 2012/0012946 A1* | 1/2012 | Yugami .......................... | 257/411 |
| 2012/0135591 A1* | 5/2012 | Dyer et al. ..................... | 438/585 |
| 2012/0196420 A1* | 8/2012 | Lee et al. ....................... | 438/299 |
| 2012/0205727 A1* | 8/2012 | Kanakasabapathy et al. .............................. | 257/288 |
| 2015/0050785 A1* | 2/2015 | Yang et al. .................... | 438/154 |

* cited by examiner

*Primary Examiner* — Caleb Henry
(74) *Attorney, Agent, or Firm* — Workman Nydegger

(57) ABSTRACT

A method for manufacturing a semiconductor device including: preparing a semiconductor substrate with a gate oxide layer on the top thereof; depositing a polycrystalline silicon layer on the top of the semiconductor substrate; depositing a protection layer overlying the top of the polycrystalline silicon layer; etching the protection layer and the polycrystalline silicon layer to form a gate body block; forming an oxide layer overlying the gate body block and the semiconductor substrate; polishing the oxide layer through Chemical Mechanical Polishing (CMP) until the top of the gate body block; removing the protection layer on the top of the gate body block; and forming a metal silicide layer on the gate body block.

14 Claims, 8 Drawing Sheets

--Prior Art--

--Prior Art--

--Prior Art--

METHOD FOR MANUFACTURING LATERALLY DIFFUSED METAL OXIDE SEMICONDUCTOR DEVICE

CROSS-REFERENCE TO RELATED APPLICATIONS

The present application claims priority to Chinese Patent Application No. 201310325729.1 filed with the Chinese Patent Office on Jul. 30, 2013 and entitled "method for manufacturing semiconductor device", which is hereby incorporated by reference in its entirety.

FIELD OF THE INVENTION

The present invention relates to a process for manufacturing a semiconductor and particularly to a method for manufacturing a semiconductor device.

BACKGROUND OF THE INVENTION

A Laterally Diffused Metal Oxide Semiconductor (LDMOS) is widely applied in the fields of a cellular phone base station, television and radio, radar, etc. A radio frequency characteristic of the LDMOS requires the resistance of its gate to be as low as possible in contrast to other types of Metal-Oxide-Semiconductor (MOS) field effect transistors. In order to lower the resistance of the gate, a process for lowering the resistance is performed on the gate, that is, a metal silicide is formed on the gate to lower the resistance of the gate.

In the prior art, the low-resistance gate satisfying the LDMOS requirement is typically manufactured in the following process.

The first step is to deposit a polycrystalline silicon layer on a semiconductor substrate.

The second step is to etch the polycrystalline silicon layer to form a gate body.

The third step is to define a body region and a drift region and to perform source/drain region implant and P+ implant.

Referring to FIG. 1A, the fourth step is to deposit a thick oxide layer 12 on the top of the gate body 11 and the semiconductor substrate 10 to form a structure as illustrated in FIG. 1A.

Referring to FIG. 1B, the fifth step is to polish the thick oxide layer 12 through Chemical Mechanical Polishing (CMP) until the top of the gate body 11 to form a structure as illustrated in FIG. 1B.

Referring to FIG. 1C, the sixth step is to form a titanium-silicon compound layer 13 on the top of the gate body 11 to form a structure as illustrated in FIG. 1C.

The seventh step is to remove the thick oxide layer 12 through dry etching.

In the foregoing fifth step, polishing the thick oxide layer until the gate body in practice may inevitably damage polycrystalline silicon constituting the gate body and consequently change starting voltages of a polycrystalline silicon resistance and a chip, thus degrading the performance of the device.

SUMMARY OF THE INVENTION

In view of the foregoing drawback in the prior art, the embodiment of the invention provides a method for manufacturing a semiconductor device so as to avoid a damage to a gate body during chemical mechanical polishing and ensure the performance of the semiconductor device from being degraded.

The embodiment of the invention provides a method for manufacturing a semiconductor device, including:

preparing a semiconductor substrate with a gate oxide layer on the top thereof;

depositing a polycrystalline silicon layer on the gate oxide layer;

depositing a protection layer overlying the top of the polycrystalline silicon layer;

etching the protection layer and the polycrystalline silicon layer to form a gate body block including the protection layer and the polycrystalline silicon layer in that order from top to bottom, which remain after being etching;

forming an oxide layer overlying the gate body block and the semiconductor substrate;

polishing the oxide layer through Chemical Mechanical Polishing (CMP) until the top of the gate body block;

removing the protection layer on the top of the gate body block; and forming a metal silicide layer on the gate body block with the protection layer removed.

In the method for manufacturing a semiconductor device according to the embodiment of the invention, firstly the protection layer is formed on the polycrystalline silicon layer, and then the oxide layer is formed and polished in a CMP process, thereby avoiding the polycrystalline silicon layer from being damaged by polishing and thus avoiding a change in gate resistance and starting voltage, so as to ensure the performance of the resulting semiconductor device.

DETAILED DESCRIPTION OF THE EMBODIMENTS

First Embodiment

Figure 1A:
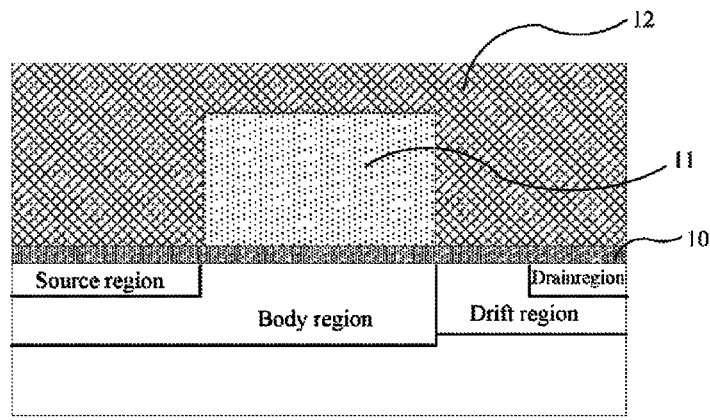
FIG. 1A is a schematic structural diagram after the thick oxide layer is formed in the process for manufacturing the low-resistance gate satisfying the LDMOS requirement in the prior art.
Figure 1B:
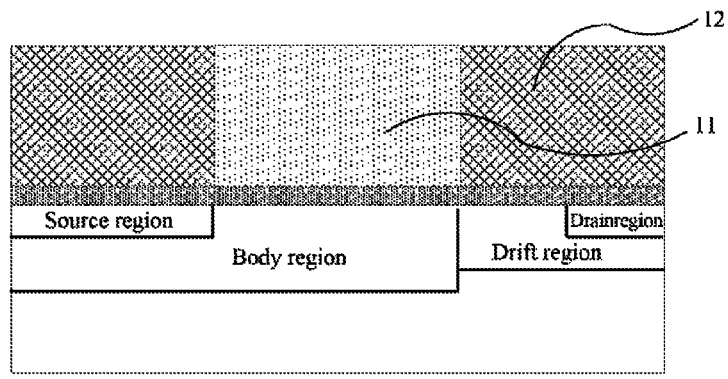
FIG. 1B is a schematic structural diagram after CMP in the process for manufacturing the low-resistance gate satisfying the LDMOS requirement in the prior art.
Figure 1C:
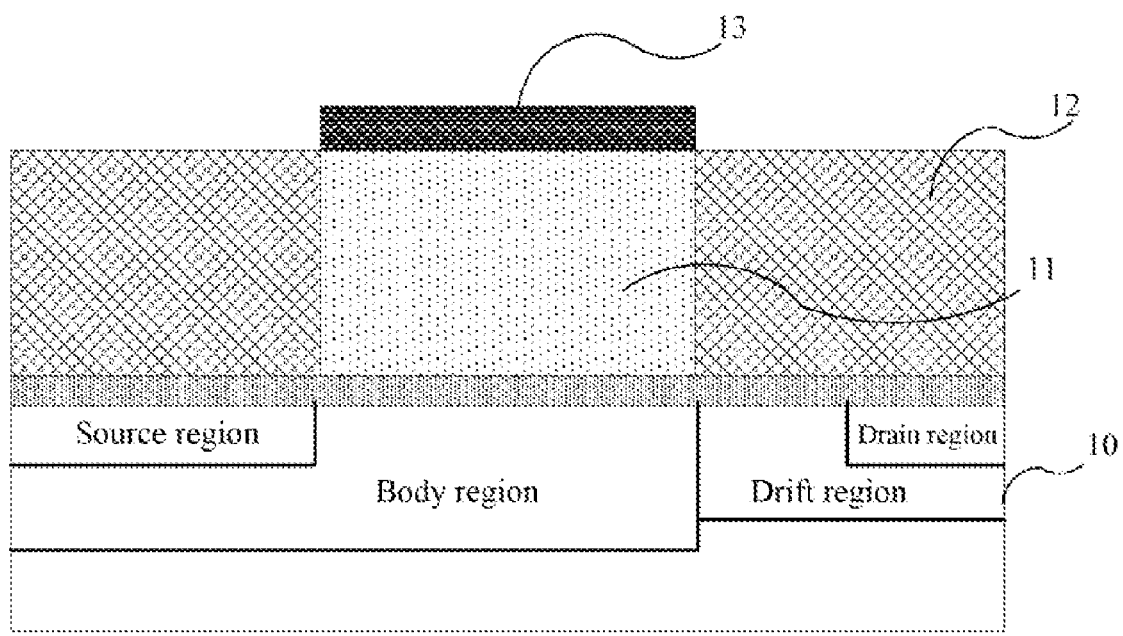
FIG. 1C is a schematic structural diagram after the titanium-silicon compound layer is formed in the process for manufacturing the low-resistance gate satisfying the LDMOS requirement in the prior art.
Figure 2:
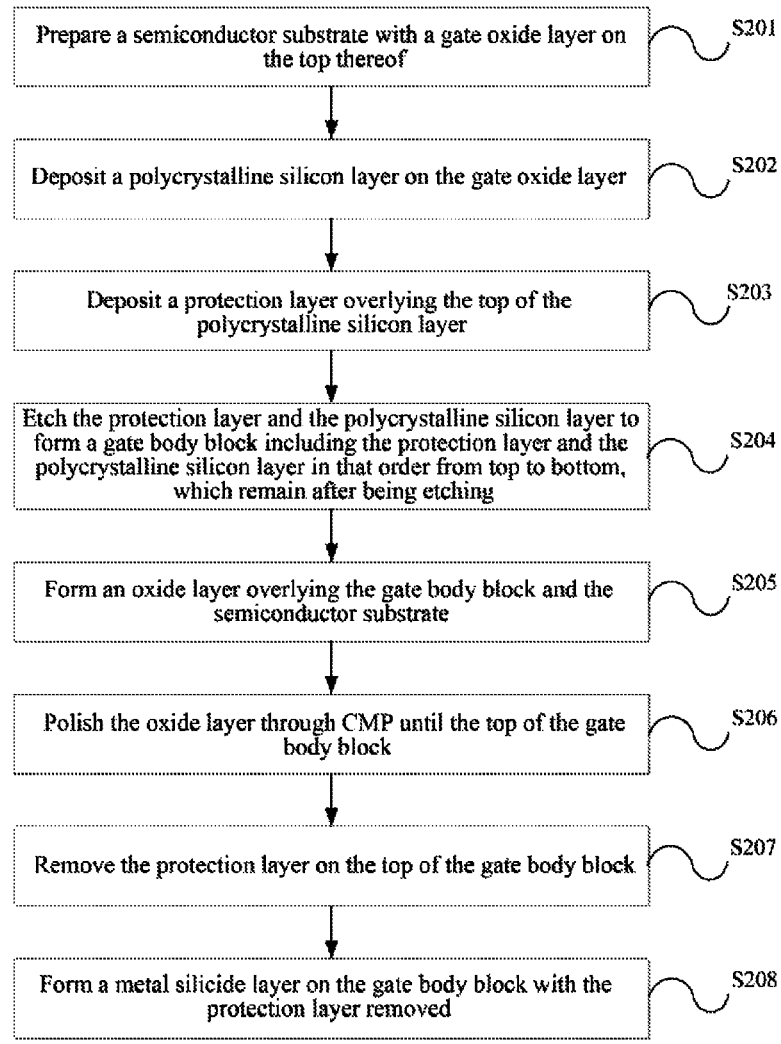
FIG. 2 is a flow chart of a method for manufacturing a semiconductor device according to an embodiment of the invention.

FIG. 2 is a flow chart of a method for manufacturing a semiconductor device according to an embodiment of the invention; and referring to FIG. 2, this embodiment provides a method for manufacturing a semiconductor device, the method includes the following steps.

Figure 3:
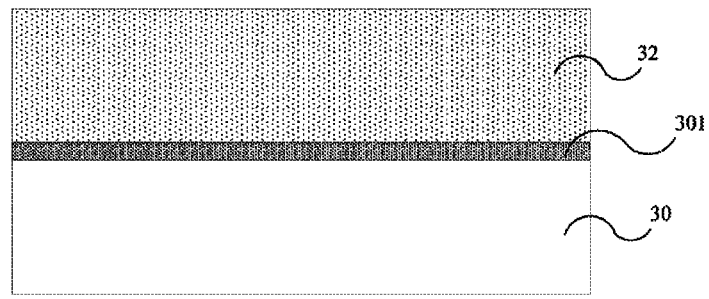
FIG. 3 is a schematic structural diagram that a polycrystalline silicon layer is formed on a semiconductor substrate in a method for manufacturing a semiconductor device according to a first embodiment of the invention.

S201 is to prepare a semiconductor substrate with a gate oxide layer on the top thereof, where the semiconductor substrate 30 can be an N-type or P-type substrate including an epitaxial layer, and the gate oxide layer 301 can be formed on the top of the semiconductor substrate 30, that is, the gate oxide layer 301 can overlie the epitaxial layer of the semiconductor substrate 30 (see FIG. 3).

Optionally in an application of this method to manufacturing of a semiconductor device which is an LDMOS, the semiconductor substrate can be a structure formed after a sinking layer is defined, an active region is defined, the gate oxide layer is grown, and polycrystalline silicon is grown.

S202 is to deposit a polycrystalline silicon layer on the gate oxide layer, where as illustrated in FIG. 3, the polycrystalline silicon layer 32 can overlie the entire top of the gate oxide layer 301 on the top of the semiconductor substrate 30, and preferably the thickness of the polycrystalline silicon layer 32 ranges from 1500 to 4000 angstroms.

Figure 4:
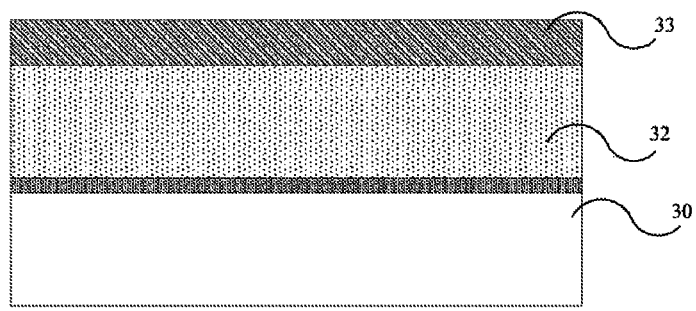
FIG. 4 is a schematic structural diagram that a protection layer is formed on the polycrystalline silicon layer in the method for manufacturing a semiconductor device according to the first embodiment of the invention.

S203 is to deposit a protection layer, where as illustrated in FIG. 4, the protection layer 33 can overlie the top of the polycrystalline silicon layer.

Specifically the protection layer 33 can be formed in a low-pressure chemical vapor deposition process.

Particularly the protection layer 33 can be a silicon nitride layer, and preferably the thickness of the silicon nitride layer ranges from 200 to 1000 angstroms.

It shall be noted that the material constituting the protection layer can be a substance different from the polycrystalline silicon layer and the oxide layer thereunder, and as such, the protection layer can be removed conveniently using some solution or gas reacting only with the protection layer but not with the polycrystalline silicon layer or the oxide layer in a subsequent step.

Figure 5A:
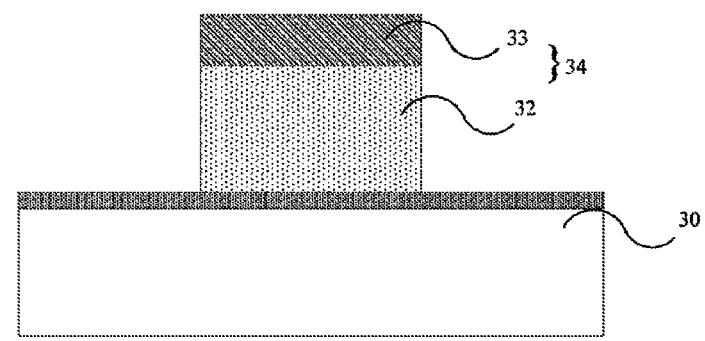
FIG. 5A is a schematic structural diagram after a gate body block is formed in the method for manufacturing a semiconductor device according to the first embodiment of the invention.

S204 is to etch the protection layer 33 and the polycrystalline silicon layer 32 to form a gate body block 34 including the protection layer 33 and the polycrystalline silicon layer 32 in that order from top to bottom, which remain after being etching, that is, to form a structure as illustrated in FIG. 5A.

Specifically the protection layer 33 and the polycrystalline silicon layer 32 are partially etched away in sequence vertically through photolithograph so that the remaining polycrystalline silicon layer 32 and protection layer 33 arranged bottom and top form the gate body block 34 protruding from the top of the semiconductor substrate (the gate body block can form a gate of the semiconductor device in subsequent steps).

Figure 5B:
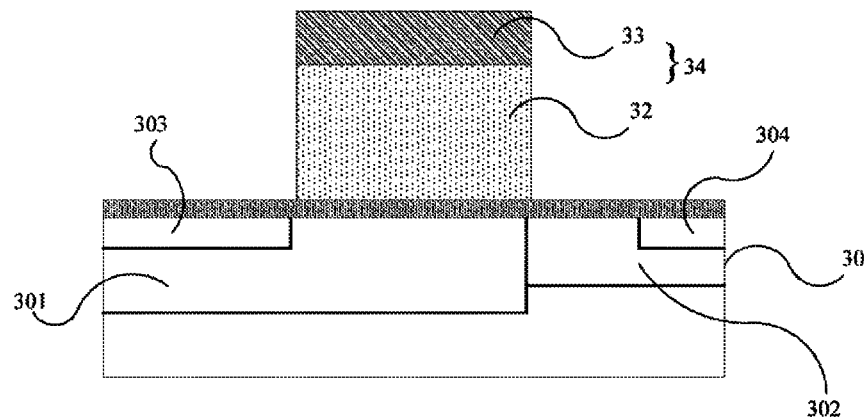
FIG. 5B is a schematic structural diagram after a body region, a drift region and source/drain regions are formed in the method for manufacturing a semiconductor device according to the first embodiment of the invention.

Optionally the method subsequent S204 can further includes:

A body region 301 and a drift region 302 are defined, and a source region 303 and a drain region 304 are formed through implant. That is, a structure as illustrated in FIG. 5B is formed.

Figure 6:
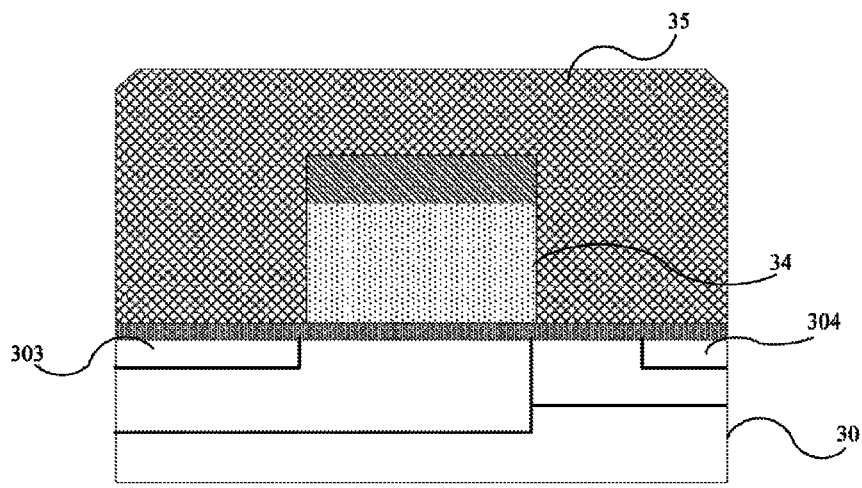
FIG. 6 is a schematic structural diagram after an oxide layer is formed in the method for manufacturing a semiconductor device according to the first embodiment of the invention.

S205 is to form an oxide layer, where as illustrated in FIG. 6, the oxide layer 35 overlies the gate body block 34 and the semiconductor substrate 30. In this embodiment, the thick oxide layer 35 is deposited on the top of the gate oxide layer of the semiconductor substrate 30 and the gate body block 34 through low-pressure chemical vapor deposition, where generally the thickness of the oxide layer 35 can be twice to three times the thickness of the gate body block 34, and as such, the gate body block 34 is buried below the oxide layer 35.

Figure 7:
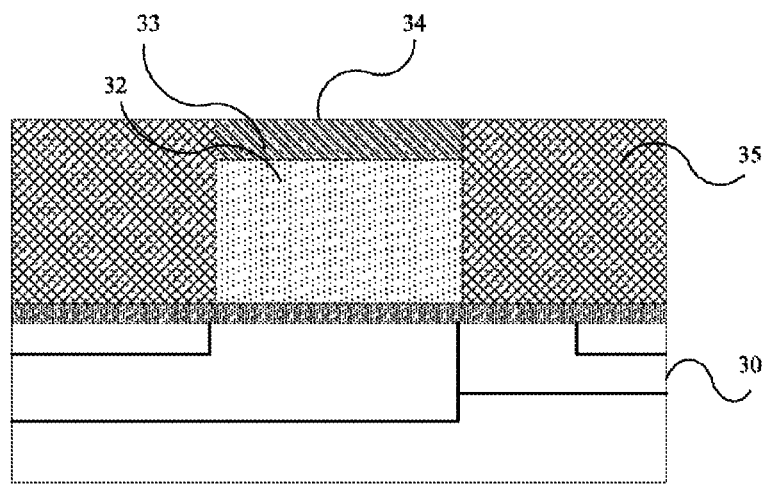
FIG. 7 is a schematic structural diagram after the oxide layer is processed through CMP in the method for manufacturing a semiconductor device according to the first embodiment of the invention.

S206 is to polish the oxide layer 35 through CMP until the top of the gate body block 34 (see FIG. 7). That is, the oxide layer 35 is polished in a CMP process from top to bottom to have the oxide layer 35 gradually decreased in thickness until the top of the gate body block 34 (the protection layer 33) is exposed. During polishing, the polycrystalline silicon layer 32 in the gate body block 34 below the protection layer 33 will not be damaged due to the protection layer 33 on the top of the gate body block 34.

A structure as illustrated in FIG. 7 is formed subsequent this step.

Figure 8:
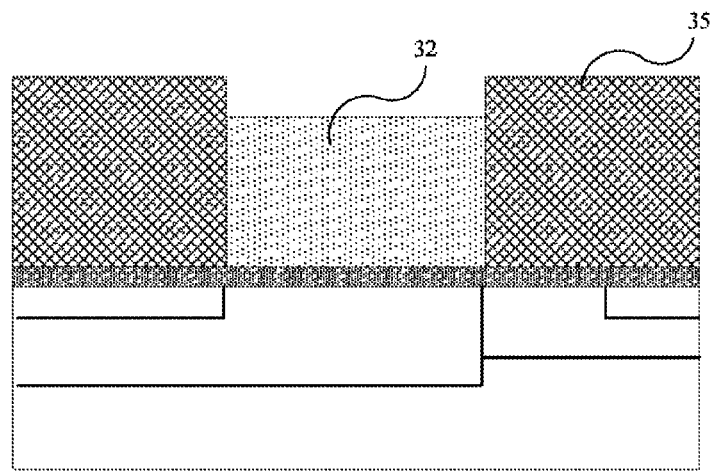
FIG. 8 is a schematic structural diagram after the protection layer is removed in the method for manufacturing a semiconductor device according to the first embodiment of the invention.

S207 is to remove the protection layer 33 on the top of the gate body block 34 while reserving only the polycrystalline silicon layer 32, that is, to form the structure as illustrated in FIG. 8.

Optionally when the protection layer 33 formed in 5203 is a silicon nitride layer, the silicon nitride layer can be washed away using phosphoric acid with a concentration of 98% and temperature of 175 □ so that only the polycrystalline silicon layer of the gate body block 34 remains (see FIG. 5A).

Figure 11:
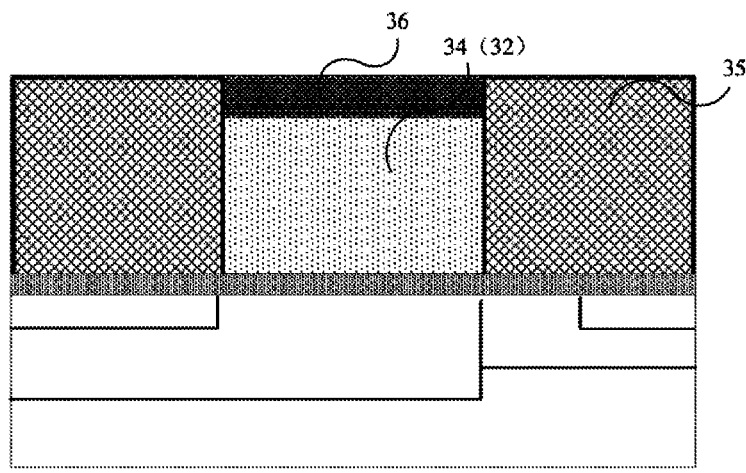
FIG. 11 is a schematic structural diagram after the metal layer is removed in the method for manufacturing a semiconductor device according to the second embodiment of the invention.

S208 is to form a metal silicide layer 36 on the gate body block 34 with the protection layer 33 removed, where referring to FIG. 11, the metal silicide layer 36 can overlie the top of the gate body block 34, and the polycrystalline silicon layer 32 and the metal silicide layer 36 overlying the polycrystalline silicon layer 32 together form a gate due to the lower resistance of the metal silicide layer 36 than the polycrystalline silicon layer.

Specifically the material of the metal silicide layer 36 can be titanium silicide (TiSi), cobalt silicide (CoSi), nickel silicide (NiSi), etc.

So far the semiconductor device is formed. The semiconductor device can provides a lower-resistance gate, and subsequently further processing can be performed on the semiconductor device as needed in practice to form different types of MOS transistors. For example, a field plate, contact holes, a first metal layer, via holes, a second metal layer and a protection layer can be defined sequentially on the semiconductor device manufactured in the method of this embodiment to thereby further form an integral LDMOS.

With the method for manufacturing a semiconductor according to this embodiment, firstly the protection layer is formed on the polycrystalline silicon layer, and then the oxide layer is formed and polished in a CMP process, thereby avoiding the polycrystalline silicon layer from being damaged by polishing and thus avoiding a change in gate resistance and starting voltage so as to ensure the performance of the resulting LDMOS device.

Second Embodiment

Based upon the foregoing embodiment, this embodiment optimizes the formation of the metal silicide layer 36 in the following process particularly including the following steps.

Figure 9:
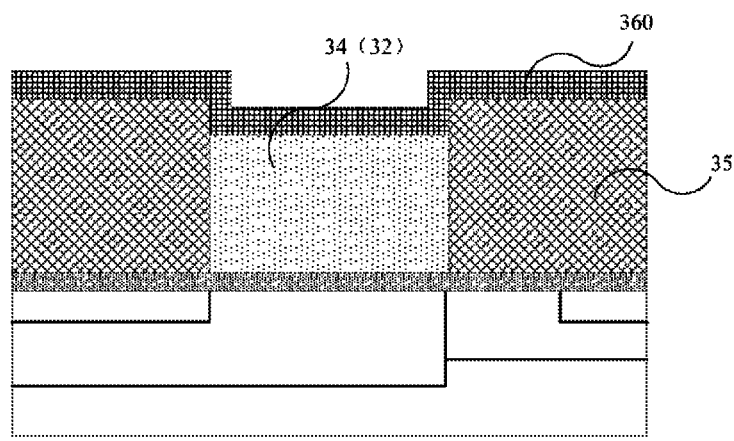
FIG. 9 is a schematic structural diagram after a metal layer is deposited in a method for manufacturing a semiconductor device according to a second embodiment of the invention.

S2081 is to deposit a metal layer, where as illustrated in FIG. 9, the metal layer 360 can overlie the gate body block 34 with the protection layer removed and the oxide layer 35, that is, the metal layer overlies the remaining polycrystalline silicon layer 32 of the gate body block 34 and the oxide layer 35. Particularly the deposited metal can be selected according to the metal silicide layer 36 to be formed (as illustrated in FIG. 11), particularly can be titanium (Ti), cobalt (Co), nickel (Ni), etc. Preferably the thickness of the metal layer 360 can range from 200 to 1000 angstroms.

Figure 10:
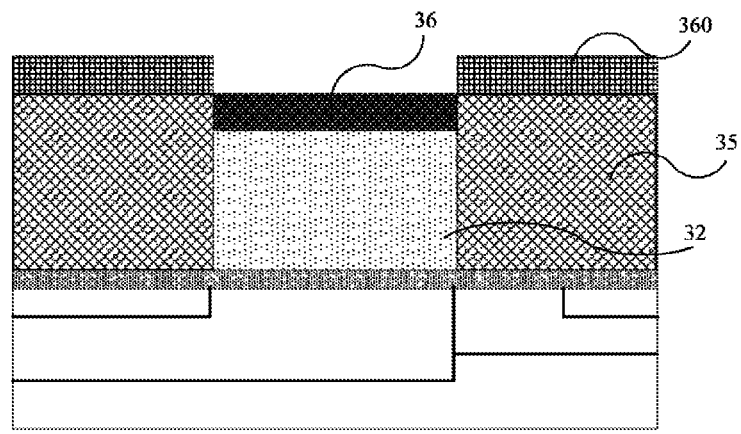
FIG. 10 is a schematic structural diagram after performing a first annealing process in the method for manufacturing a semiconductor device according to the second embodiment of the invention.

S2082 is to perform a first annealing process on the metal layer 360 to have the metal layer 360 above the gate body block into reaction with the top of the polycrystalline silicon layer 32 to form the metal silicide layer 36 while reserving the majority of the metal layer 360 overlying the oxide layer 35, thereby forming a structure as illustrated in FIG. 10 subsequent to this step, where the first annealing process is at temperature ranging from 650 to 750 □ for a period of time ranging from 20 to 40 seconds.

Optionally when the metal layer 360 is a titanium layer with a thickness ranging from 200 to 1000 angstroms, then the material of the metal silicide layer 36 formed after the first annealing process is titanium silicide.

S2083 is to remove the metal layer 360, where the remaining metal layer 360 can be washed away using a mixed solution of sulphuric acid ($H_2SO_4$) and hydrogen peroxide ($H_2O_2$) or a mixed solution of ammonium hydroxide (NH4OH) and hydrogen peroxide ($H_2O_2$).

S2084 is to perform a second annealing process on the metal silicide layer to further lower the resistance of the metal silicide layer, where the second annealing process is at temperature ranging from 800 to 900° C. for a period of time ranging from 20 to 40 seconds.

Figure 12:
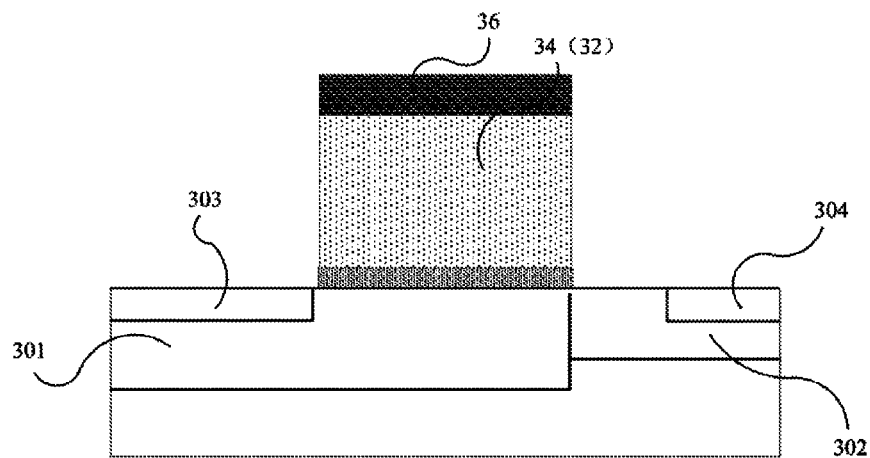
FIG. 12 is a schematic structural diagram of the semiconductor device formed in the method for manufacturing a semiconductor device according to the first or second embodiment of the invention.

Furthermore the method subsequent to S2084 can further includes a step to remove the oxide layer 35 (as illustrated in FIG. 12).

Specifically the oxide layer 35 formed previously on the semiconductor substrate 30 can be etched away through dry etching. This etching step needs a high etch selectivity ratio of the oxide layer to the metal silicide layer (where the etch selectivity ratio refers to the rate, at which the oxide layer is etched, divided by the rate at which the metal silicide layer is etched; and TiSi will be more difficult to be etched as this ratio value is increased) so as to avoid titanium silicide in the metal silicide layer 36 from an excess loss, where the metal silicide layer can be titanium silicide; and a resulting structure is as illustrated in FIG. 12.

With this embodiment, metal deposition and the first annealing process can have low-resistance metal silicide prepared conveniently and rapidly on the polycrystalline silicon layer of the gate body block, and the second annealing process can have the phase of the metal silicide changed, thereby further lowering the resistance of the metal silicide layer greatly, and further facilitating the improved performance of the resulting MOS transistor.

Lastly it shall be noted that the foregoing respective embodiments are merely illustrative of the technical solution of the invention but not to limit the same; and although the invention has been detailed above in connection with the foregoing embodiments, those ordinarily skilled in the art shall appreciate that they can modify the technical solution disclosed in the foregoing respective embodiments or make equivalent substitutions for a part or all of the technical features without departing from the scope of the invention.

The invention claimed is:

1. A method for manufacturing a semiconductor device, comprising:
   preparing a semiconductor substrate with a gate oxide layer on the top thereof;
   depositing a polycrystalline silicon layer on the gate oxide layer;
   depositing a protection layer overlying the top of the polycrystalline silicon layer;
   etching the protection layer and the polycrystalline silicon layer to form a gate body block including the protection layer and the polycrystalline silicon layer in that order from top to bottom, which remain after being etching;
   forming an oxide layer overlying the gate body block and the semiconductor substrate;
   polishing the oxide layer through Chemical Mechanical Polishing, CMP, until the top of the gate body block;
   removing the protection layer on the top of the gate body block;
   depositing a metal layer overlying the gate body block with the protection layer removed and the oxide layer;
   performing a first annealing process on the metal layer to have the metal layer on the gate body layer into action with the polycrystalline silicon layer to form a metal silicide layer on the gate body block with the protection layer removed;
   removing the metal layer; and
   performing a second annealing process on the metal silicide layer to further lower the resistance of the metal silicide.

2. The method for manufacturing a semiconductor device according to claim 1, wherein a metal of the metal layer is titanium or nickel or cobalt, and the metal silicide is titanium silicide or nickel silicide or cobalt silicide.

3. The method for manufacturing a semiconductor device according to claim 1, wherein a metal of the metal layer is titanium or nickel or cobalt, and the metal silicide is titanium silicide or nickel silicide or cobalt silicide.

4. The method for manufacturing a semiconductor device according to claim 1, wherein the thickness of the metal layer ranges from 200 to 1000 angstrom.

5. The method for manufacturing a semiconductor device according to claim 4, wherein:
   the first annealing process is at temperature ranging from 650 to 750 ° C. for a period of time ranging from 20 to 40 seconds; and
   the second annealing process is at temperature ranging from 800 to 900 ° C. for a period of time ranging from 20 to 40 seconds.

6. The method for manufacturing a semiconductor device according to claim 1, wherein the thickness of the polycrystalline silicon layer ranges from 1500 to 4000 angstroms.

7. The method for manufacturing a semiconductor device according to claim 1, wherein the thickness of the polycrystalline silicon layer ranges from 1500 to 4000 angstroms.

8. The method for manufacturing a semiconductor device according to claim 1, wherein the thickness of the polycrystalline silicon layer ranges from 1500 to 4000 angstroms.

9. The method for manufacturing a semiconductor device according to claim 1,
   wherein the protection layer is a silicon nitride layer with a thickness ranging from 200 to 1000 angstroms; and
   wherein removing the protection layer on the top of the gate body block further comprises:
   corroding the protection layer by using phosphoric acid.

10. The method for manufacturing a semiconductor device according to claim 1,
    wherein the protection layer is a silicon nitride layer with a thickness ranging from 200 to 1000 angstroms; and
    wherein removing the protection layer on the top of the gate body block further comprises:
    corroding the protection layer by using phosphoric acid.

11. The method for manufacturing a semiconductor device according to claim 1,
    wherein the protection layer is a silicon nitride layer with a thickness ranging from 200 to 1000 angstroms; and
    wherein removing the protection layer on the top of the gate body block further comprises:
    corroding the protection layer by using phosphoric acid.

12. The method for manufacturing a semiconductor device according to claim 1, wherein the thickness of the oxide layer is twice to three times the thickness of the gate body block.

13. The method for manufacturing a semiconductor device according to claim 1, wherein the thickness of the oxide layer is twice to three times the thickness of the gate body block.

14. The method for manufacturing a semiconductor device according to claim 1, wherein the thickness of the oxide layer is twice to three times the thickness of the gate body block.

\* \* \* \* \*